United States Patent
Bhatti et al.

(10) Patent No.: US 7,406,999 B2
(45) Date of Patent: Aug. 5, 2008

(54) CAPILLARY-ASSISTED COMPACT THERMOSIPHON

(75) Inventors: Mohinder Singh Bhatti, Amherst, NY (US); Ilya Reyzin, Williamsville, NY (US); Debashis Ghosh, Williamsville, NY (US)

(73) Assignee: Delphi Technologies, Inc., Troy, MI (US)

( * ) Notice: Subject to any disclaimer, the term of this patent is extended or adjusted under 35 U.S.C. 154(b) by 210 days.

(21) Appl. No.: 11/412,287

(22) Filed: Apr. 27, 2006

(65) Prior Publication Data
US 2007/0251674 A1 Nov. 1, 2007

(51) Int. Cl.
*F28D 15/02* (2006.01)
(52) U.S. Cl. .................. 165/104.26; 165/129
(58) Field of Classification Search ............ 165/104.21, 165/104.26, 80.3–80.5, 129, 130, 185, DIG. 330–2, 165/DIG. 338, 80.1, 80.2; 257/715; 361/700, 361/703
See application file for complete search history.

(56) References Cited

U.S. PATENT DOCUMENTS

| | | | | |
|---|---|---|---|---|
| 4,012,770 A | * | 3/1977 | Pravda et al. ............ 165/104.26 |
| 6,657,862 B2 | * | 12/2003 | Crocker et al. ............... 165/185 |
| 6,840,311 B2 | | 1/2005 | Ghosh ................... 165/104.33 |
| 6,867,974 B2 | | 3/2005 | Luo ........................... 361/700 |
| 6,986,384 B2 | | 1/2006 | Wagner ................. 165/104.33 |
| 2003/0102110 A1 | * | 6/2003 | Wagner ...................... 165/80.3 |
| 2004/0108104 A1 | * | 6/2004 | Luo ............................ 165/80.3 |
| 2005/0006061 A1 | * | 1/2005 | Quisenberry et al. ... 165/104.33 |

* cited by examiner

Primary Examiner—Teresa J Walberg
(74) Attorney, Agent, or Firm—Patrick M. Griffin

(57) ABSTRACT

A thermosiphon cooling assembly cools an electronic device with a conical condensing tube disposed about a curved central axis curving upwardly from a top of the evaporating unit to an upper distal end and a shroud disposed outward of an exterior surface of the condensing tube at the upper distal end extending axially along the central axis from the upper distal end to a lower edge spaced from the top defining an air opening. An air moving device moves air about the central axis within the shroud to the air opening. A plurality of condensing fins are disposed in the condensing tube and each condensing fin forms a pair of corners with an interior surface of the condensing tube and a wick material is disposed in each of the corners to return condensed vapor to the evaporating unit.

36 Claims, 5 Drawing Sheets

CAPILLARY-ASSISTED COMPACT THERMOSIPHON

BACKGROUND OF THE INVENTION

1. Field of the Invention

The subject invention relates to a thermosiphon cooling assembly for cooling an electronic device.

2. Description of the Prior Art

The operating speed of computers is constantly being improved to create faster and faster computers. With this, comes increased heat generation and a need to effectively dissipate that heat.

Heat exchangers and heat sink assemblies have been used that apply natural or forced convection cooling methods to dissipate heat from electronic devices that are highly concentrated heat sources such as microprocessors and computer chips. These heat exchangers typically use air to directly remove heat from the electronic devices; however air has a relatively low heat capacity. Thus, liquid-cooled units called LCUs employing a cold plate in conjunction with high heat capacity fluids have been used to remove heat from these types of heat sources. Although LCUs are satisfactory for moderate heat flux, increasing computing speeds have required more effective heat sink assemblies.

Accordingly, thermosiphon cooling units (TCUs) have been used for cooling electronic devices having a high heat flux. A typical TCU absorbs heat generated by the electronic device by vaporizing the working fluid housed on the boiler plate of the unit. The boiling of the working fluid constitutes a phase change from liquid-to-vapor state and as such the working fluid of the TCU is considered to be a two-phase fluid. The vapor generated during boiling of the working fluid is then transferred to a condensing tube, where it is liquefied by the process of film condensation over the condensing surface of the TCU. The heat is rejected into a stream of air flowing through a tube running through the condensing tube or flowing over fins extending from the condensing tube. The condensed liquid is returned back to the boiler plate by gravity to continue the boiling-condensing cycle.

Examples of cooling systems for electronic devices are disclosed in U.S. Pat. No. 6,867,974 to Luo; U.S. Pat. No. 6,986,384 to Wagner et al.; and U.S. Pat. No. 6,840,311 to Ghosh et al.

The Luo patent discloses an assembly for cooling an electronic device having an evaporating unit housing a liquid refrigerant connected to a condensing tube where the condensing tube may resemble a truncated cone having a cross section that is gradually reduced in a direction away from the evaporating unit. Vapor produced by boiling the refrigerant gathers in the condensing tube and the heat contained within the vapor is transferred to cooling fins attached to the exterior of the condensing tube.

The Wagner et al. patent discloses an assembly for cooling an electronic device having an air moving device mounted directly to the cooling assembly to move air across the cooling assembly on a central axis perpendicular to the assembly. The Ghosh et al. patent discloses an assembly for cooling an electronic device having an evaporating unit, a condensing tube, and internal condensing fins located within the condensing tube. The condensing fins transfer heat contained within vapor boiled off a liquid refrigerant to the exterior of the assembly.

Although the prior art dissipates heat from electronic devices, as computing speeds increase, there is a continuing need for alternative cooling devices having more efficient heat transfer capabilities.

SUMMARY OF THE INVENTION AND ADVANTAGES

In accordance with the subject invention, heat generated by an electronic device is transferred to an evaporating unit having a top. A refrigerant is disposed in the evaporating unit for liquid-to-vapor transformation. Heat is absorbed by the refrigerant, and vapor boiled off the refrigerant gathers in a condensing tube having an exterior surface and an interior surface. The condensing tube is disposed about and along a central axis extending upwardly from the top of the evaporating unit to an upper distal end. An air moving device is disposed about the central axis to propel air along the exterior surface of the condensing tube and parallel to the central axis at the upper distal end of the condensing tube. The central axis is curved from the top of the evaporating unit to the upper distal end in order to make the unit compact. Vapor boiled off the refrigerant condenses over the interior surface of the condensing tube and the condensate is returned to the evaporating unit by gravity to continue the boiling-condensing cycle.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
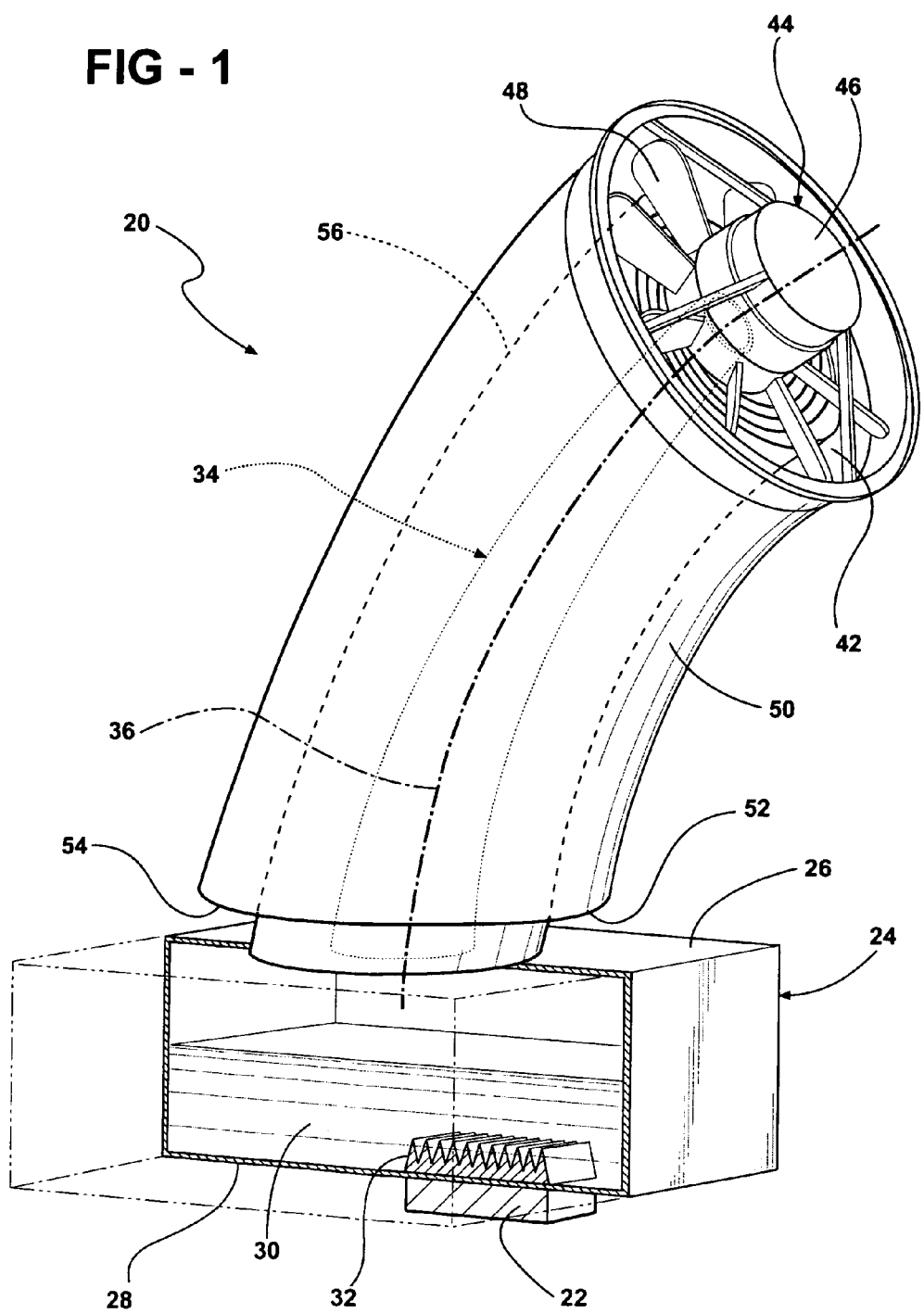
FIG. 1 is a perspective view of a first embodiment of the thermosiphon cooling assembly showing the evaporating unit cut away with the lower edge of the shroud parallel to the top of the evaporating unit.

Referring to the Figures, wherein like numerals indicate corresponding parts throughout the several views, a thermosiphon cooling assembly 20 is shown generally for cooling an electronic device 22.

The thermosiphon cooling assembly 20 comprises an evaporating unit 24 generally indicated and having a top 26 for receiving heat from the electronic device 22. The assembly 20 is used to cool the electronic device 22 engaging or secured to the exterior of the evaporating unit 24. The top 26 is generally flat, and the evaporating unit 24 generally has a rectangular cross-section and a bottom 28 that is generally flat and spaced vertically from the top 26.

A refrigerant 30 is disposed in the evaporating unit 24 for liquid-to-vapor transformation. The refrigerant 30 absorbs heat generated by the electronic device 22 and transferred into the evaporating unit 24. The refrigerant 30 is evaporated by the heat transferred from the electronic device 22 and the resultant vapor is later condensed and returned to the refrigerant pool. The refrigerant 30 is preferably essentially dielectric in character to prevent any electrocution hazard in the event of leakage of the fluid. A refrigerant like R-134a is suitable for this purpose.

A plurality of boiler fins 32 extend from the bottom 28 of the evaporating unit 24 for increasing heat transfer from the electronic device 22 to the interior of the evaporating unit 24. The boiler fins 32 extend upwardly from the bottom 28 of the evaporating unit 24 towards the top 26. The boiler fins 32 are disposed in the evaporating unit 24 for transferring heat from the electronic device 22 disposed on the exterior of the evaporating unit 24 by boiling the refrigerant 30 in the evaporating unit 24.

A condensing tube 34 generally indicated is disposed about and along a central axis 36 extending upwardly from the top 26 of the evaporating unit 24. The condensing tube 34 has an interior surface 38 connected to and in fluid communication with the evaporating unit 24 for allowing refrigerant vapor to travel from the evaporating unit 24 to the condensing tube 34 and for allowing condensed refrigerant vapor to travel from the condensing tube 34 back to the evaporating unit 24. The condensing tube 34 also has an exterior surface 40 preferably of a conical shape disposed about and along the central axis 36 extending upwardly from the top 26 of the evaporating unit 24 with the cross-sectional area of the condensing tube 34 decreasing along the central axis 36 from the top 26 to an upper distal end 42. The condensing tube 34 houses vapor boiled off the refrigerant 30 until the vapor condenses at which time it is returned to the evaporating unit 24. The condensing tube 34 is hermetically sealed to the evaporating unit 24 about the central axis 36 to contain the refrigerant 30.

The central axis 36 is curved between the top 26 of the evaporating unit 24 and the upper distal end 42. The central axis 36 is curved in order to make the unit compact. The central axis 36 preferably extends at an acute angle to the top 26 of the evaporating unit 24 and the central axis 36 also preferably extends at an acute angle at the upper distal end 42 in relation to the top 26 of the evaporating unit 24.

Figure 3:
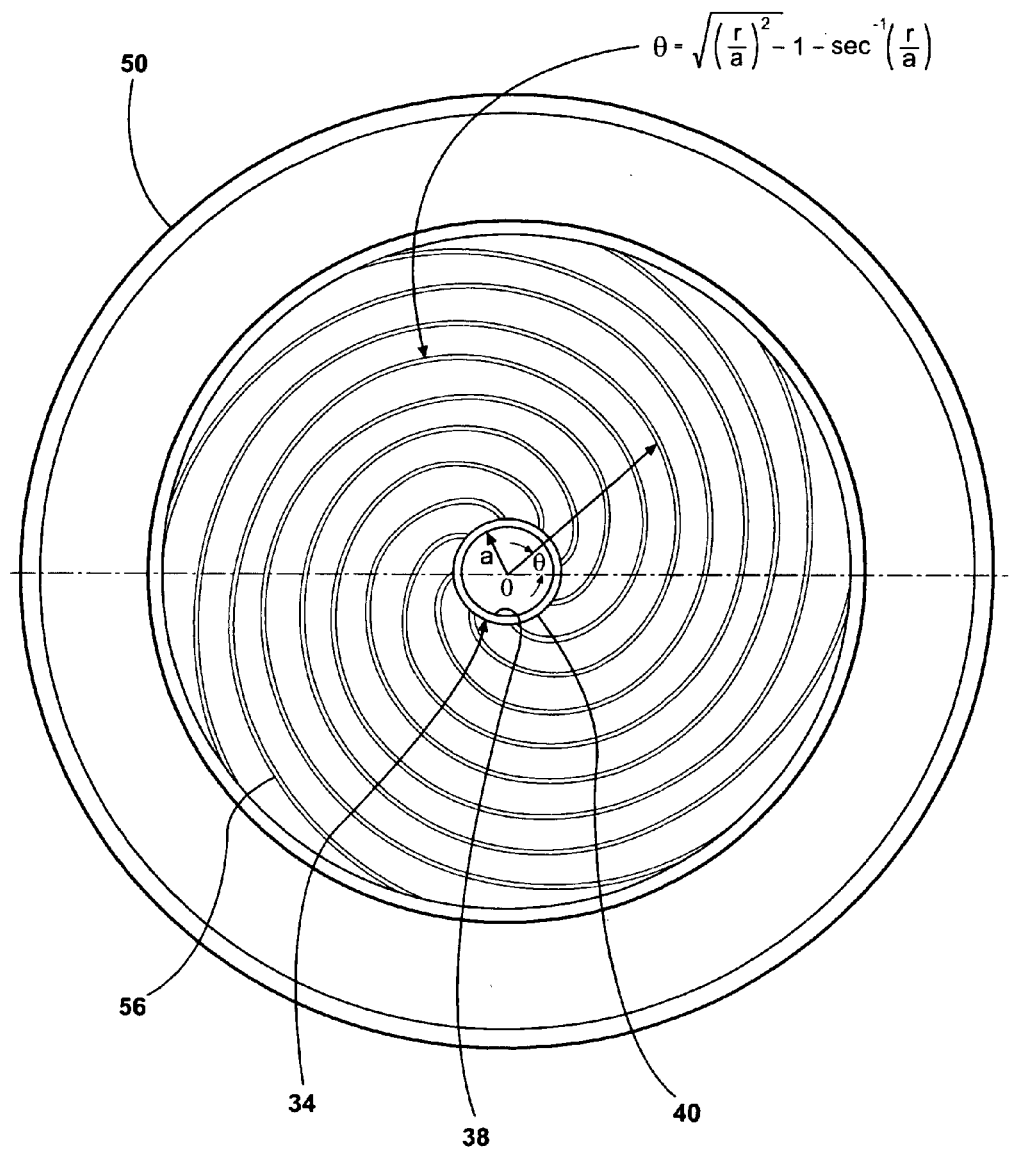
FIG. 3 is a cross sectional view of the assembly shown in FIG. 2 along 3-3 with the condensing fins and wick material left out for clarity.
Figure 4:
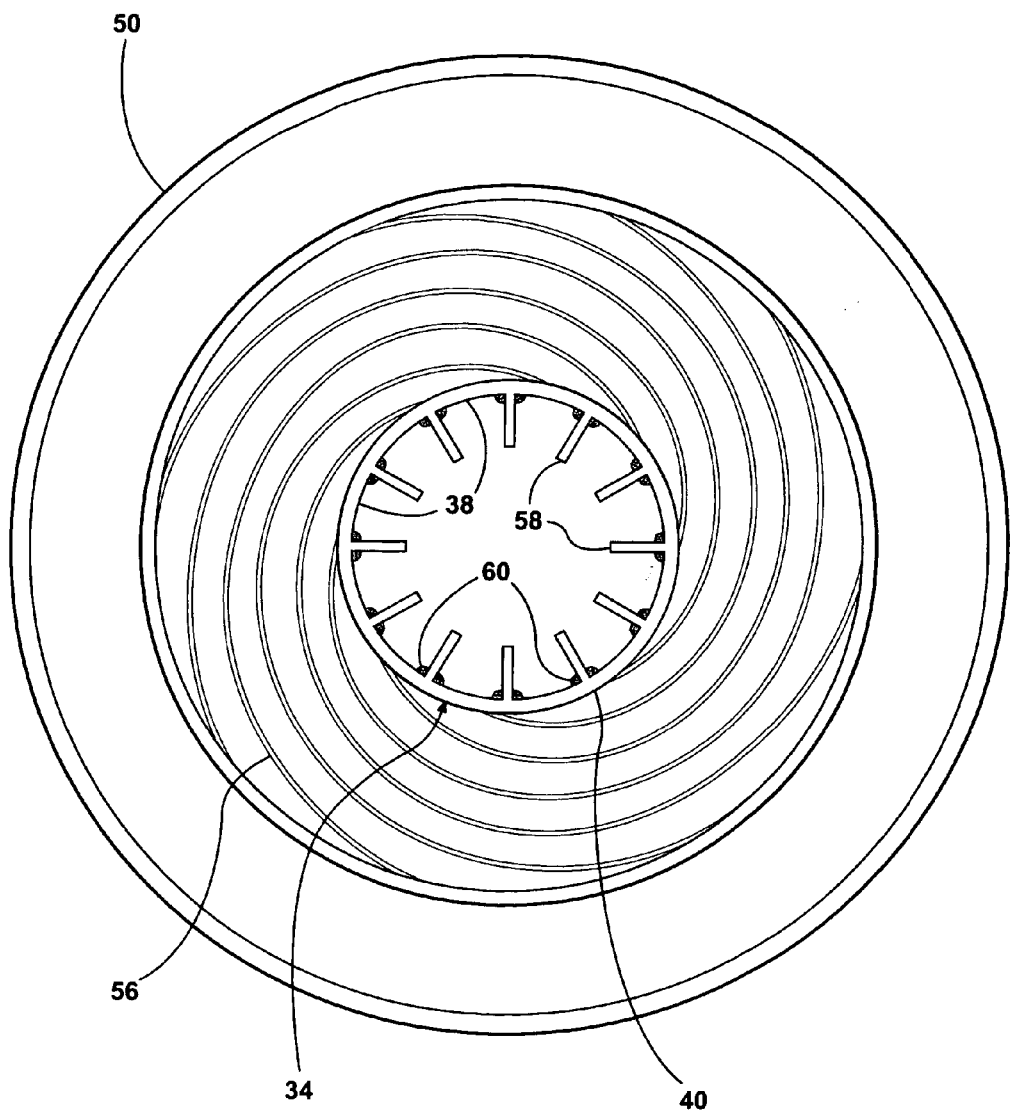
FIG. 4 is a cross sectional view of the assembly shown in FIG. 2 along 4-4.

A plurality of cooling fins 44 are disposed about the exterior surface 40 of the condensing tube 34 for transferring heat from the condensing tube 34. The cooling fins 44, as shown in FIG. 3, preferably spiral counter-clockwise from the exterior surface 40 of the condensing tube 34 to a fin tube 46 and extend axially along the central axis 36. As illustrated in FIG. 3, the cooling fins 44 are parallel to each other and in a spiral configuration to increase the surface area of the cooling fins 44 and the heat transferred from the condensing tube 34. The spacing between adjacent cooling fins 44 remains constant from the exterior surface 40 of the condensing tube 34 to the fin tube 46. FIGS. 3 and 4 illustrate cross-sections of the cooling fins 44 disposed about the conical shaped condensing tube 34 wherein the cross-sectional area of the condensing tube 34 decreases along the central axis 36 from the top 26 of the evaporating unit 24 to the upper distal end 42. Referring to FIG. 3, each cooling fin 44 includes a spiral angle ($\theta$) defined by the equation:

$$\theta = \sqrt{(r/a)^2 - 1} - \sec^{-1}(r/a)$$

where "r" is the radius from the central axis 36 to a point located on the curve of the cooling fin 44 and "a" is the radius of the cross-section of the condensing tube 34 which varies along the central axis 36, i.e., decreases towards the upper distal end 42.

The fin tube 46 is disposed outward of the exterior surface 40 of the condensing unit and has a circular cross-section of constant diameter and curves along the central axis 36 from the upper distal end 42 to the top 26.

An air moving device 48 generally indicated, here shown as a single axial fan, is located about the central axis 36 for propelling air along the exterior surface 40 of the condensing tube 34 and parallel to the central axis 36 at the upper distal end 42 of the condensing tube 34. The air moving device 48 increases the flow of air over the exterior surface 40 of the condensing tube 34 to increase the rate at which heat contained within the condensing tube 34 is rejected to the air moving over the condensing tube 34. The air moving device 48 can either be of the push or pull type.

The air moving device 48 generally has a hub 50 and a plurality of vanes 52 for propelling air. The hub 50 is preferably supported on the central axis 36 at the upper distal end 42 of the condensing tube 34, and it preferably extends radially perpendicularly to the central axis 36. Positioning the hub 50 on the upper distal end 42 of the condensing tube 34 eliminates the shadowing effect created by the air moving device 48. The hub 50 also preferably extends radially outward at least to the exterior surface 40 of the condensing tube 34 at the upper distal end 42. The vanes 52 preferably extend perpendicular to the central axis 36 and radially outward of the exterior surface 40 of the condensing tube 34 at the upper distal end 42 for propelling air over the exterior surface 40 and parallel to the central axis 36 at the upper distal end 42. As shown in FIG. 1, the vanes 52 generally extend radially from the hub 50. A support member secures the air moving device 48 to the condensing tube 34 at the upper distal end 42 as shown in FIG. 1.

Figure 2:
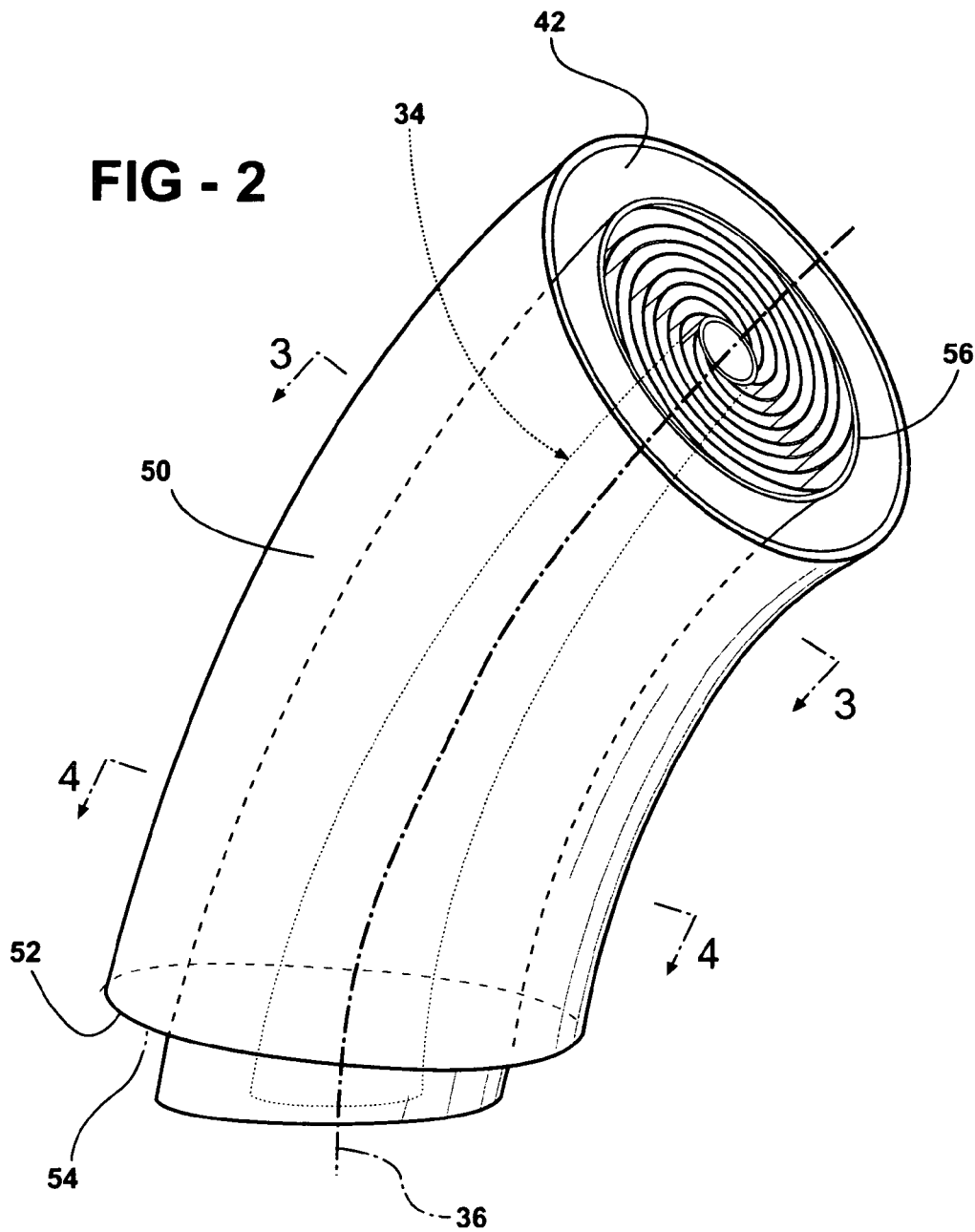
FIG. 2 is a perspective view of a portion of a second embodiment of the thermosiphon cooling assembly showing the condensing tube, cooling fins, and shroud with the lower edge of the shroud at an obtuse angle in relation to the top of the evaporating unit.

The air moving device 48 generally includes a shroud 54 disposed outward of the exterior surface 40 of the condensing tube 34 at the upper distal end 42 and extending axially along the central axis 36 from the upper distal end 42 to a lower edge 56 spaced from the top 26 of the evaporating unit 24. The lower edge 56 defines an air opening 58 whereby air is propelled by the air moving device 48 along the exterior surface 40 of the condensing tube 34 and out of the air opening 58. The shroud 54 has a circular cross-section and extends outward of and surrounds the vanes 52 at the upper distal end 42. The circular cross-section is of a constant diameter and curves along the central axis 36 to the air opening 58. The air opening 58 preferably directs air propelled by the air moving device 48 at an acute angle in relation to the top 26 of the evaporating unit 24, as most clearly illustrated in FIG. 2. In the embodiment of FIG. 1, the air opening 58 is parallel to the top 26 of the evaporating unit 24 and is elliptical. The shroud 54 directs air propelled by the air moving device 48 through the shroud 54 and along the exterior surface 40 of the condensing tube 34 and out of the air opening 58 for transferring heat from the exterior surface 40 of the condensing tube 34.

A plurality of condensing fins 60 are disposed on the interior surface 38 of the condensing tube 34 to increase heat transfer from the refrigerant vapor to the exterior surface 40 of the condensing tube 34. As shown in FIG. 4, the condensing fins 60 are generally spaced circumferentially about and axially along the central axis 36 and preferably converge to the upper distal end 42 of the condensing tube 34. The condensing fins 60 have been left out of FIG. 3 for clarity. The condensing fins 60 extend radially inward and perpendicular from the interior surface 38 of the condensing tube 34 for cooling vapor in the condensing tube 34. The condensing fins 60 absorb heat contained within the refrigerant vapor and transfer the heat to the exterior surface 40 of the condensing tube 34.

Figure 5:
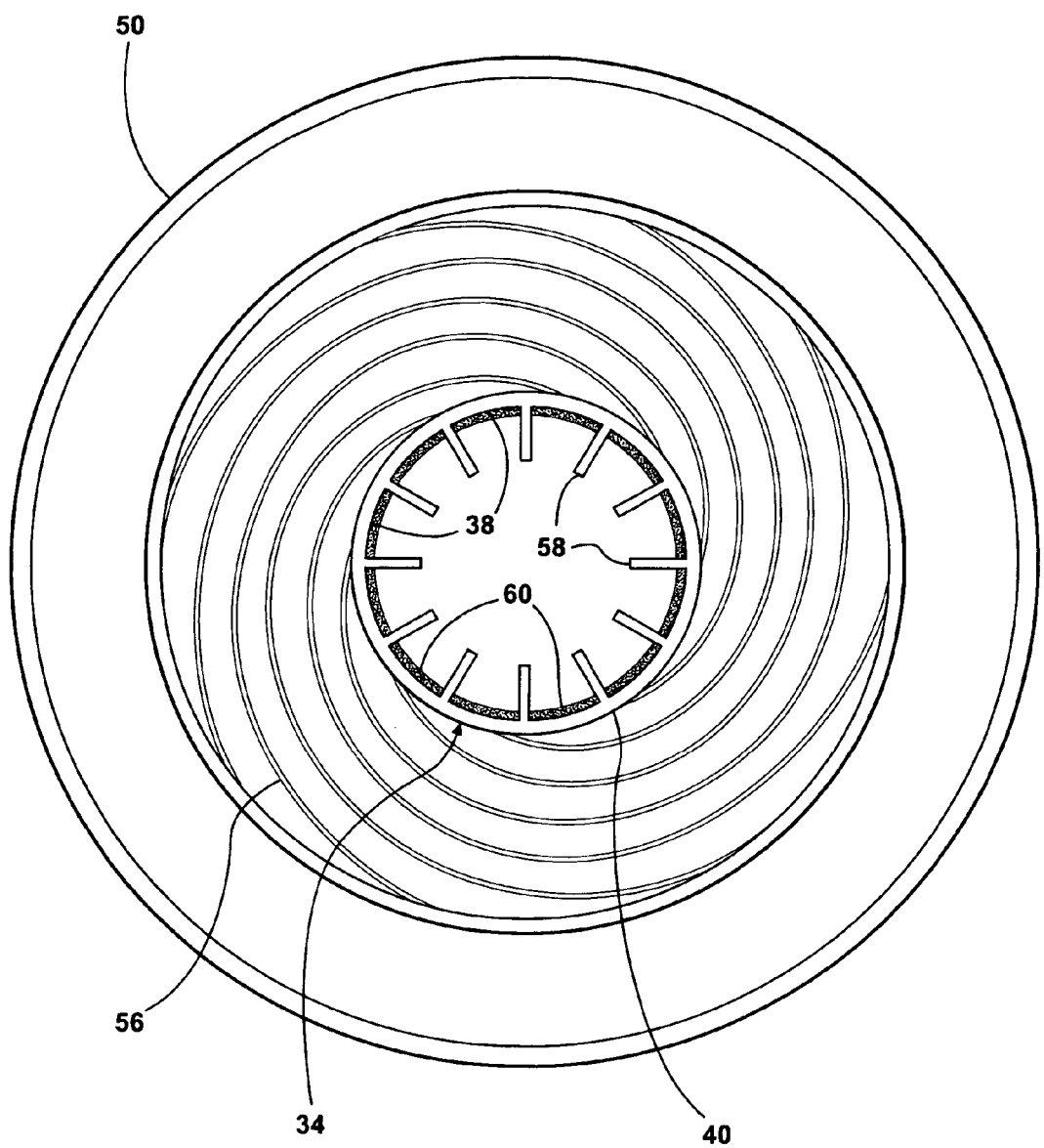
FIG. 5 is an alternative embodiment of FIG. 4 showing the wick material extending over the interior surface of the condensing tube between the corners of adjacent condensing fins.

A wick material 62 is disposed in the evaporating unit 24 and extends into the condensing tube 34 and along the condensing fins 60 for conveying liquid from the condensing tube 34 to the evaporating unit 24. The wick material 62 has been left out of FIG. 3 for clarity. The condensing fins 60 preferably are not covered with the wick material 62 because covering the condensing fins 60 with the wick material 62 would increase the thermal resistance of the condensing fins 60 and inhibit condensation. As shown in FIG. 4, each condensing fin 60 and the interior surface 38 of the condensing tube 34 forms a pair of corners, and the wick material 62 is preferably disposed in each of the corners extending along the corners from the upper distal end 42 to the top 26 of the evaporating unit 24 for wicking the condensate from the condensing fins 60 to the evaporating unit 24. The wick material 62 occupies the corners attracting the condensate from the condensing fins 60 by the surface tension. In the embodiment illustrated in FIG. 4, the wick material 62 has a rod-like cross-section and extends along the corners from the upper distal end 42 to the top 26. The condensate on the condensing fin 60 and the interior surface 38 of the condensing tube 34 is moved to the wick material 62 by the surface tension. The condensate moves along the wick material 62 to the evaporating unit 24. In the embodiment shown in FIG. 5, the wick material 62 extends completely over the interior surface 38 of the condensing tube 34 between the corners of adjacent condensing fins 60.

The wick material 62 generally has a porosity that is variable in order to change the thermal resistance of the wick material 62 and preferably the porosity of the wick material 62 in the condensing tube 34 is greater than the porosity of the wick material 62 in the evaporating unit 24. This creates a greater wicking ability in the condensing tube 34 while still promoting nucleate boiling within the wick material 62 in the evaporating unit 24.

The wick material 62 additionally generally has a thickness that changes in order to vary the liquid holding capacity of the wick material 62. Preferably the thickness of the wick material 62 in the condensing tube 34 decreases along the central axis 36 from the top 26 of the evaporating unit 24 toward the upper distal end 42 of the condensing tube 34.

Obviously, many modifications and variations of the present invention are possible in light of the above teachings. The invention may be practiced otherwise than as specifically described within the scope of the appended claims.

What is claimed is:

1. A thermosiphon cooling assembly for cooling an electronic device comprising;
    an evaporating unit having a top,
    a refrigerant disposed in said evaporating unit for liquid-to-vapor transformation,
    a condensing tube having an interior surface and an exterior surface disposed about and along a central axis and extending upwardly from said top of said evaporating unit to an upper distal end,
    an air moving device disposed about said central axis for propelling air along said exterior surface and parallel to said central axis at said upper distal end of said condensing tube, and
    said central axis being curved from said top of said evaporating unit to said upper distal end.

2. An assembly as set forth in claim 1 wherein said central axis at said upper distal end extends at an acute angle in relation to said top of said evaporating unit.

3. An assembly as set forth in claim 2 including a plurality of cooling fins disposed about said exterior surface of said condensing tube for transferring heat from said condensing tube.

4. An assembly as set forth in claim 3 wherein said cooling fins extend axially along said central axis.

5. An assembly as set forth in claim 4 wherein said cooling fins spiral outwardly from said exterior surface of said condensing tube to a fin tube having a circular cross-section of constant diameter and curving along said central axis from said upper distal end to said top.

6. An assembly as set forth in claim 5 wherein said cooling fins are parallel to each other and have a constant space between adjacent cooling fins from said exterior surface of said condensing tube to said fin tube.

7. An assembly as set forth in claim 6 wherein each cooling fin includes a spiral angle (θ) defined by:

$$\theta = \sqrt{((r/a)^2 - 1)} - \sec^{-1}(r/a)$$

wherein r is the radius from said central axis to a point located on the curve of said cooling fin and a is the radius of the cross-section of said condensing tube with said radius varying along said central axis from said top to said upper distal end.

8. An assembly as set forth in claim 3 wherein said air moving device includes a shroud disposed outward of said exterior surface at said upper distal end and extending axially along said central axis from said upper distal end to a lower edge spaced from said top for defining an air opening whereby air is propelled by said air moving device along said exterior surface of said condensing tube and out of said air opening.

9. An assembly as set forth in claim 8 wherein said air moving device has a plurality of vanes extending perpendicular to said central axis and radially outward of said exterior surface to a position radially inward of said shroud at said upper distal end for propelling air along said exterior surface of said condensing tube and over said cooling fins and parallel to said central axis at said upper distal end.

10. An assembly as set forth in claim 9 wherein said air moving device has a hub supported about said central axis on said upper distal end of said condensing tube and extending radially perpendicularly to said central axis and wherein said vanes extend radially from said hub.

11. An assembly as set forth in claim 10 wherein said hub extends radially outwardly at least to said exterior surface of said condensing tube at said upper distal end.

12. An assembly as set forth in claim 8 wherein said central axis extends at an acute angle to said top of said evaporating unit.

13. An assembly as set forth in claim 3 wherein said exterior surface of said condensing tube is of a conical shape disposed about and along said central axis extending upwardly from said top of said evaporating unit with the cross-sectional area of said condensing tube decreasing along said central axis from said top to said upper distal end.

14. An assembly as set forth in claim 13 wherein said air moving device includes a shroud disposed outward of said exterior surface at said upper distal end and extending axially along said central axis from said upper distal end to a lower edge spaced from said top for defining an air opening whereby air is propelled by said air moving device along said exterior surface of said condensing tube and out of said air opening.

15. An assembly as set forth in claim 14 wherein said shroud has a circular cross-section of constant diameter and curves along said central axis to said air opening and said lower edge defining said air opening being parallel to said top whereby said air opening is elliptical.

16. An assembly as set forth in claim 3 including a wick material disposed in said evaporating unit and extending into said condensing tube for conveying liquid from said condensing tube to said evaporating unit.

17. An assembly as set forth in claim 3 including a plurality of condensing fins disposed about said interior surface.

18. An assembly as set forth in claim 17 wherein said condensing fins extend radially inwardly and perpendicularly from said interior surface and axially along said central axis for cooling vapor in said condensing tube.

19. An assembly as set forth in claim 17 including a wick material disposed in said evaporating unit and extending into said condensing tube along said condensing fins for conveying liquid from said condensing fins to said evaporating unit.

20. An assembly as set forth in claim 19 wherein said interior surface of said condensing tube and each condensing fin forms a pair of corners and said wick material is disposed in each of said corners to extend along said corners whereby liquid is conveyed to said corners by surface tension and to said evaporating unit by said wick material.

21. An assembly as set forth in claim 20 wherein said wick material is in a rod-like shape and extends along each of said corners.

22. An assembly as set forth in claim 20 wherein said wick material extends over said interior surface of said condensing tube between said corners of adjacent condensing fins.

23. An assembly as set forth in claim 19 wherein said wick material has a thickness that changes for varying the liquid holding capacity of said wick material and with said thickness of said wick material decreasing along said central axis from said top of said evaporating unit toward said upper distal end of said condensing tube.

24. An assembly as set forth in claim 19 wherein said wick material has a porosity that is variable for changing the thermal resistance of said wick material and with said porosity of said wick material in said condensing tube being greater than said porosity of said wick material in said evaporating unit.

25. An assembly as set forth in claim 3 wherein said top is flat and wherein said evaporating unit has a rectangular cross-section and a flat bottom spaced vertically from said top for receiving heat from the electronic device.

26. An assembly as set forth in claim 3 wherein said evaporating unit is hermetically sealed to said condensing tube about said central axis.

27. An assembly as set forth in claim 3 including a plurality of boiler fins disposed in said evaporating unit for transferring heat from said electronic device to said refrigerant.

28. A thermosiphon cooling assembly for cooling an electronic device comprising;
an evaporating unit having a top,
a refrigerant disposed in said evaporating unit for liquid-to-vapor transformation,
a condensing tube disposed about a central axis extending upwardly from said top of said evaporating unit and having an interior surface connected to and in fluid communication with said evaporating unit,
a plurality of condensing fins spaced about said interior surface of said condensing tube and extending axially along said central axis, and
a wick material disposed in said evaporating unit and extending into said condensing tube along said condensing fins for conveying liquid from said condensing tube to said evaporating unit;
wherein said interior surface of said condensing tube and each condensing fin forms a pair of corners and said wick material is disposed in each of said corners to extend along said corners whereby liquid is conveyed to said corners by surface tension and to said evaporating unit by said wick material.

29. An assembly as set forth in claim 28 wherein said wick material is in a rod-like shape and extends along each of said corners.

30. An assembly as set forth in claim 28 wherein said wick material extends over said interior surface of said condensing tube between said corners of adjacent condensing fins.

31. An assembly as set forth in claim 28 wherein said wick material has a thickness that changes for varying the liquid holding capacity of said wick material and with said thickness of said wick material in said condensing tube decreasing along said central axis from said top of said evaporating unit toward said upper distal end of said condensing tube.

32. An assembly as set forth in claim 28 wherein said wick material has a porosity that is variable for changing the thermal resistance of said wick material and with said porosity of said wick material in said condensing tube being greater than said porosity of said wick material in said evaporating unit.

33. A thermosiphon cooling assembly for cooling an electronic device comprising;
an evaporating unit having a rectangular cross-section and a flat top and a flat bottom spaced vertically from said top for receiving heat from the electronic device,
a refrigerant disposed in said evaporating unit for liquid-to-vapor transformation,
a plurality of boiler fins disposed in said evaporating unit for transferring heat from said electronic device to said refrigerant,
a condensing tube having an exterior surface of a conical shape disposed about and along a central axis extending upwardly from said top of said evaporating unit with the cross-sectional area of said condensing tube decreasing along said central axis from said top to an upper distal end and having an interior surface connected to and in fluid communication with said evaporating unit,
said evaporating unit being hermetically sealed to said condensing tube about said central axis,
said central axis extending at an acute angle to said top and being curved from said top of said evaporating unit to said upper distal end and extending at said upper distal end at an acute angle in relation to said top,
a plurality of cooling fins disposed about said exterior surface of said condensing tube and spiraling counter-clockwise about said central axis from said exterior surface of said condensing tube to a fin tube and extending axially along said central axis and being parallel to each other and having a constant space between adjacent cooling fins,
said fin tube having a circular cross-section of constant diameter and curving along said central axis from said upper distal end to said top,
an air moving device having a hub and a plurality of vanes for propelling air along said exterior surface and parallel to said central axis at said upper distal end and over said cooling fins,
said hub of said air moving device supported on said central axis on said upper distal end of said condensing tube and extending radially perpendicularly to said central axis and outwardly at least radially to said exterior surface of said condensing tube at said upper distal end,
said vanes extending perpendicular to said central axis and radially outward of said exterior surface at said upper distal end for propelling air along said exterior surface and parallel to said central axis at said upper distal end and over said cooling fins,
said air moving device including a shroud disposed outward of said vanes at said upper distal end and extending axially along said central axis from said upper distal end to a lower edge spaced from said top for defining an air opening whereby air is propelled by said air moving device along said exterior surface of said condensing tube and over said cooling fins and out of said air opening, said shroud having a circular cross-section of constant diameter and curving along said central axis to said air opening and said edge defining said air opening being parallel to said top whereby said air opening is elliptical, a plurality of condensing fins spaced circumferentially about and axially along said central axis and extending radially inwardly and perpendicularly from said interior surface of said condensing tube for cooling vapor in said condensing tube, a wick material disposed in said evaporating unit and extending into said condensing tube and along said condensing fins for conveying liquid from said condensing tube to said evaporating unit, and each condensing fin forming a pair of corners with said interior surface and said wick material being disposed in each of said corners to extend along each of said corners whereby liquid is conveyed to said corners by surface tension and to said evaporating unit by said wicking material.

34. An assembly as set forth in claim 33 wherein each cooling fin includes a spiral angle ($\theta$) defined by:

$$\theta = \sqrt{((r/a)^2 - 1)} - \sec^{-1}(r/a)$$

wherein r is the radius from said central axis to a point located on the curve of said cooling fin and a is the radius of the cross-section of said condensing tube with said radius varying along said central axis from said top to said upper distal end.

35. An assembly as set forth in claim 33 wherein said wick material has a thickness that changes for varying the liquid holding capacity of said wick material and with said thickness of said wick material in said condensing tube decreasing along said central axis from said top of said evaporating unit toward said upper distal end of said condensing tube.

36. An assembly as set forth in claim 33 wherein said wick material has a porosity that is variable for changing the thermal resistance of said wicking material and with said porosity of said wick material in said condensing tube being greater than said porosity of said wick material in said evaporating unit.

* * * * *